(12) United States Patent
Saito et al.

(10) Patent No.: US 6,762,369 B2
(45) Date of Patent: Jul. 13, 2004

(54) MULTILAYER CERAMIC SUBSTRATE AND METHOD FOR MANUFACTURING THE SAME

(75) Inventors: Ryuichi Saito, Hirakata (JP); Hidenori Katsumura, Kobe (JP); Hiroshi Kagata, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/282,293

(22) Filed: Oct. 28, 2002

(65) Prior Publication Data

US 2003/0094307 A1 May 22, 2003

(30) Foreign Application Priority Data

Oct. 29, 2001 (JP) .......................................... 2001-331329

(51) Int. Cl.[7] ............................. H05K 1/11; H01R 12/04
(52) U.S. Cl. ........................ 174/262; 174/256; 174/261; 174/264; 361/792; 428/210
(58) Field of Search ................................ 174/262, 265, 174/264, 256, 280, 257, 261; 361/746, 760, 792, 795, 803; 428/210

(56) References Cited

U.S. PATENT DOCUMENTS

| | | | | |
|---|---|---|---|---|
| 4,650,923 A | * | 3/1987 | Nishigaki et al. | 174/257 |
| 4,795,670 A | * | 1/1989 | Nishigaki et al. | 428/209 |
| 5,627,344 A | * | 5/1997 | Tanifuji et al. | 174/257 |
| 5,702,653 A | * | 12/1997 | Riley | 264/614 |
| 5,932,326 A | | 8/1999 | Kashima et al. | |
| 6,156,433 A | * | 12/2000 | Hatori et al. | 428/411.1 |
| 6,338,893 B1 | * | 1/2002 | Kodera et al. | 428/210 |
| 6,406,778 B1 | * | 6/2002 | Natarajan et al. | 428/209 |

FOREIGN PATENT DOCUMENTS

| | | |
|---|---|---|
| EP | 0 535 711 | 10/1992 |
| JP | 64-81106 | 3/1989 |
| JP | 10-051088 | 2/1998 |
| JP | 2785544 | 5/1998 |

* cited by examiner

*Primary Examiner*—David A. Zaineke
*Assistant Examiner*—J B Patel
(74) *Attorney, Agent, or Firm*—Merchant & Gould, P.C.

(57) ABSTRACT

A multilayer ceramic substrate includes a glass ceramic body, a conductive pattern, and a via conductor. The conductive pattern is formed in the glass ceramic body and on at least one principal surface of the glass ceramic body. The via conductor makes a connection between the predetermined conductive patterns. The via conductor includes a conductive material and a Mo compound or a Mo metal. The conductive material includes at least one selected from the group consisting of Ag, Au, Pt and Pd as a main component. The amount of Mo compound or Mo metal is in the range of 0.05 to 10 parts by weight in terms of Mo metal with respect to 100 parts by weight of the conductive material. This multilayer ceramic substrate can achieve sufficient flatness and high dimensional accuracy, while preventing defects that occurs in the vicinity of electrodes after firing.

13 Claims, 2 Drawing Sheets

MULTILAYER CERAMIC SUBSTRATE AND METHOD FOR MANUFACTURING THE SAME

BACKGROUND OF THE INVENTION

1. Field of the Invention

The present invention relates to a multilayer ceramic substrate used for a high-density multilayer circuit substrate.

2. Description of the Related Art

A multilayer ceramic substrate produced by firing at low temperatures (hereinafter, referred to as a multilayer ceramic substrate) is used for a high-density circuit substrate. The multilayer ceramic substrate is produced by stacking a plurality of ceramic green sheets, each of which has a conductive pattern formed by a conductor composition, and firing the laminate of the ceramic green sheets. To connect the conductive pattern of one layer to that of the other layer, through holes (via holes) are formed in the green sheet of the desired layer beforehand, and then conductor paste (i.e., the conductor composition) is filled into the via holes. Thereafter, the laminate that includes the green sheet having the through holes filled with the conductor paste is fired. In this manner, the green sheets and the conductor paste are fired simultaneously so as to form an electrode in the via holes. Consequently, the conductive patterns of the desired layers are connected, thereby providing a three-dimensional circuit.

However, in a conventional firing, there are many cases where the firing shrinkage behavior of a conductor differs from that of ceramics. This makes it difficult to produce a large flat substrate. Moreover, a variation in shrinkage during firing also makes it difficult to produce a substrate with high dimensional accuracy.

To solve the above problems, the following method is proposed by JP 2785544 B2. Another green sheet is prepared by using an inorganic composition that is not sintered at the firing temperature of each of the green sheets constituting a laminate. This green sheet thus prepared is stacked on the upper and the lower surface of the laminate as constraint layers, and then fired. According to this method, the shrinkage of the green sheet laminate in the in-plane direction is restricted by the constraint layers, so that the shrinkage selectively occurs only in the thickness direction. Thus, a substrate with favorable flatness and dimensional accuracy can be achieved. The constraint layers are not sintered even after firing and can be removed easily.

However, the above method using the constraint layers is likely to cause defects at the interface between a conductor and ceramics due to a difference in sintering timing or firing shrinkage behavior between the conductor and the ceramics in a firing process. Specifically, the defects are caused easily between an internal electrode and a ceramic body and between a via electrode and the ceramic body. These defects significantly reduce the reliability of the substrate.

A method that does not use the constraint layer can suppress the above defects because the shrinkage occurs three-dimensionally in a firing process. Even if such defects are caused, they are small enough to be repaired fully during firing. However, when the constraint layer is used, the shrinkage in the in-plane direction hardly occurs. Therefore, once defects are caused, it is almost impossible to repair the defects, so that they remain even in the final stage.

SUMMARY OF THE INVENTION

Therefore, with the foregoing in mind, it is an object of the present invention to provide a multilayer ceramic substrate that can achieve sufficient flatness and high dimensional accuracy, while preventing defects that occur in the vicinity of electrodes after firing.

A multilayer ceramic substrate of the present invention includes a glass ceramic body, a conductive pattern, and a via conductor. The conductive pattern is formed in the glass ceramic body and on at least one principal surface of the glass ceramic body. The via conductor makes a connection between two or more of the conductive patterns. The via conductor includes a conductive material and a Mo compound or a Mo metal. The conductive material includes at least one selected from the group consisting of Ag, Au, Pt and Pd as a main component. The amount of Mo compound or Mo metal is in the range of 0.05 to 10 parts by weight in terms of Mo metal with respect to 100 parts by weight of the conductive material. This multilayer ceramic substrate can achieve sufficient flatness and high dimensional accuracy, while preventing defects in the vicinity of electrodes.

It is preferable that oxide particles that include at least one selected from the group consisting of alumina, zirconia and magnesia as a main component are arranged on the at least one principal surface of the glass ceramic body. This configuration can prevent solder leaching.

A multilayer ceramic substrate according to another example of the present invention is produced by: forming a laminate by stacking a plurality of green sheets so that at least one of the green sheets has via holes filled with a conductor composition; stacking a constraint green sheet on both surfaces of the laminate, the constraint green sheet being made of ceramics that is sinterable at a temperature higher than a firing temperature of the laminate; and firing the laminate with the constraint green sheets. The green sheets may be made of glass ceramics. The conductor composition includes conductive powder and a Mo compound or a Mo metal. The conductive powder may include at least one selected from the group consisting of Ag, Au, Pt and Pd. The amount of Mo compound or Mo metal is in the range of 0.05 to 10 parts by weight in terms of Mo metal with respect to 100 parts by weight of the conductive powder. This multilayer ceramic substrate can achieve sufficient flatness for mounting semiconductors, chips, etc. and high dimensional accuracy, while preventing defects in the vicinity of electrodes. Therefore, the electrical characteristics of the multilayer ceramic substrate are not degraded, making it highly reliable.

It is preferable that the conductor composition further includes a glass frit in an amount of not more than 10 parts by weight. The addition of the glass frit can increase the adhesive strength in firing the conductor composition and adjust the final contraction of the conductor composition to be produced.

The conductor composition further may include a frit of an inorganic composition used in the glass ceramics in an amount of not more than 10 parts by weight.

The amount of Mo compound or Mo metal included in the conductor composition may be not less than 0.05 parts by weight and less than 3 parts by weight in terms of Mo metal.

It is preferable that the glass frit has a softening point of not less than 650° C. This can eliminate the deviation in sintering timing between the green sheet and the conductor composition and prevent defects in the vicinity of electrodes.

A method for manufacturing a multilayer ceramic substrate of the present invention includes the following: forming a laminate by stacking a plurality of green sheets so that at least one of the green sheets has via holes filled with a conductor composition; stacking a constraint green sheet on both surfaces of the laminate, the constraint green sheet being made of ceramics that is sinterable at a temperature higher than a firing temperature of the laminate; and firing the laminate with the constraint green sheets. The green sheets may be made of glass ceramics. The conductor composition includes conductive powder and a Mo compound or a Mo metal. The conductive powder may include at least one selected from the group consisting of Ag, Au, Pt and Pd. The amount of Mo compound or Mo metal is in the range of 0.05 to 10 parts by weight in terms of Mo metal with respect to 100 parts by weight of the conductive powder. This method can provide a multilayer ceramic substrate that can achieve sufficient flatness for mounting semiconductors, chips, etc. and high dimensional accuracy, while preventing defects in the vicinity of electrodes. Therefore, the electrical characteristics of the multilayer ceramic substrate are not degraded, making it highly reliable.

It is preferable that the constraint green sheet is removed after firing the laminate so that a portion of the constraint green sheet is left as particles. This method can provide a multilayer ceramic substrate that can prevent solder leaching.

A multilayer ceramic substrate of the present invention is produced by using a green sheet and a conductor composition. The green sheet is made of glass ceramics. The conductor composition includes conductive powder and a Mo compound or a Mo metal. The conductive powder includes at least one selected from the group consisting of Ag, Au, Pt and Pd. The amount of Mo compound or Mo metal is in the range of 0.05 to 10 parts by weight in terms of Mo metal with respect to 100 parts by weight of the conductive powder. This multilayer ceramic substrate can achieve sufficient flatness for mounting semiconductors, chips, etc. and high dimensional accuracy, while preventing defects in the vicinity of electrodes. Therefore, the electrical characteristics of the multilayer ceramic substrate are not degraded, making it highly reliable.

DESCRIPTION OF THE PREFERRED EMBODIMENTS

Figure 1:
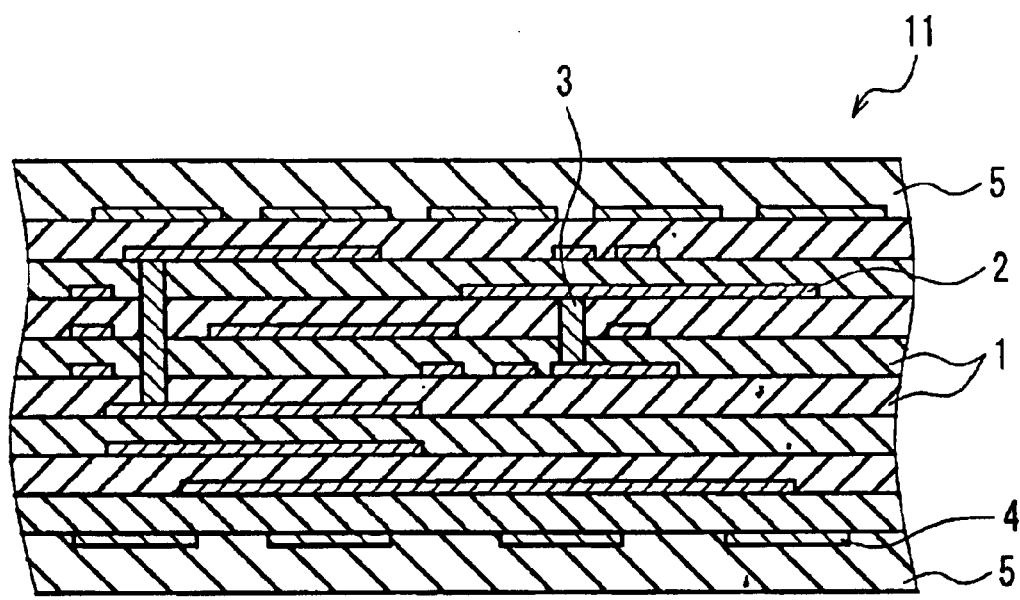
FIG. 1 is a cross-sectional view showing the configuration of a multilayer ceramic substrate before firing according to an embodiment of the present invention.

Hereinafter, a multilayer ceramic substrate and a method for manufacturing the same according to an embodiment of the present invention will be described with reference to the drawings. FIG. 1 is a cross-sectional view showing the configuration of a multilayer ceramic substrate before firing.

First, a method for manufacturing a multilayer ceramic substrate of this embodiment will be described in due order. A green sheet 1 is, e.g., a glass ceramic green sheet made of $Al_2O_3$ and glass. Glass powder for the glass ceramic green sheet is, e.g., a composition containing two or more substances that are selected appropriately from $SiO_2$, $B_2O_3$, $Al_2O_3$, $CaCO_3$, $SrCO_3$, $BaCO_3$, $La_2O_3$, $ZrO_2$, $TiO_2$, $MgO$, $PbO$, $ZnO$, $Li_2CO_3$, $Na_2CO_3$ and $K_2CO_3$. This is only an example of the composition of the green sheet 1, and other compositions may be used as long as they can be fired together with a conductor composition that is formed into an internal electrode 2 and a via electrode 3.

To $Al_2O_3$ and the glass powder is added a polyvinyl butyral binder, a plasticizer, and an organic solvent, which then is dispersed to form a slurry. This slurry is shaped into a sheet with a green sheet forming method such as a doctor blade method. For example, the green sheet 1 having a thickness of 20 to 100 μm is formed on a base film such as a PET film.

The green sheet 1 thus formed is cut into a predetermined size. Then, via holes are formed in the green sheet 1, e.g., by punching or laser processing. If necessary, pilot holes for lamination can be formed at the same time. After a predetermined number of green sheets 1 are prepared, a conductor composition is printed on the surface of each of the green sheets 1 by screen printing to form a conductive pattern. When a multilayer ceramic substrate is completed, the conductive pattern provided on the surface of the substrate serves as a surface electrode 4, and the conductive pattern provided in the substrate serves as an internal electrode 2. Moreover the conductor composition is filled into the via holes to form a via electrode 3.

The following is an explanation of the conductor composition that is filled into the via holes and is printed on the green sheet surface as a conductive pattern. It is desirable that this conductor composition is conductor paste including conductive powder and a Mo compound or Mo metal. The conductor paste may further include a glass frit and an organic vehicle as needed. The conductor composition is preferred to be in paste form when the printing property of the internal electrode 2 and the filling property of the via electrode 3 in the via holes are taken into consideration.

The conductive powder may be at least one selected from Ag, Pd, Pt, and Au. That is, the conductive powder can use these metals individually, a mixture of these metals, or alloy powder of these metals. The average particle diameter of the conductive powder is in the range of 0.5 to 10 μm. For economic reasons, it is preferable that the conductive powder is Ag powder, a mixture of Ag powder and Pd or Pt powder, or alloy powder of Ag and Pd or Pt.

The Mo compound is, e.g., a molybdenum organic compound such as $MoO_3$, molybdenum naphthenate, molybdenum 2-ethylhexanoate and molybdenum octanoate, or a silicide such as $MoSi_2$. For purposes of this application, the term "Mo compound" also may include a Mo metal unless the context indicates to the contrary.

It is desirable that the amount of Mo compound is in the range of 0.05 to 10 parts by weight in terms of Mo metal with respect to 100 parts by weight of the conductive powder. When the amount of Mo compound is less than 0.05 parts by weight, the adding effect of the Mo compound is small. When the amount of Mo compound is more than 10 parts by weight, though the Mo compound can give a great effect, conductor resistance increases significantly after the conductor composition is fired, thus reducing the usefulness of the multilayer ceramic substrate.

In view of the conductor resistance, it is more preferable that the amount of Mo compound is less than 3 parts by weight. That is, the particularly preferred amount of Mo compound is not less than 0.05 parts by weight and less than 3 parts by weight in terms of Mo metal.

The glass frit can be a lead borosilicate, borosilicate, zinc silicate, or aluminoborosilicate glass frit. However, the glass frit is not limited thereto. It is preferable that the glass frit has an average particle diameter of not more than 10 μm and a softening point of not less than 650° C. When the particle diameter of the glass frit is large, the dispersibility of the glass frit becomes so poor that uniform paste cannot be provided. When the softening point of the glass frit is low, sintering of the conductive powder is accelerated to make a difference in sintering speed between the electrode and the ceramic body, thus causing defects easily.

The glass frit may be added in an amount of 0 to 10 parts by weight with respect to 100 parts by weight of the conductive powder, and preferably in an amount of 0 to 5 parts by weight. The addition of the glass frit can increase the adhesive strength and adjust the final contraction of the conductor composition to be produced.

A material for the organic vehicle may be obtained, e.g., by dissolving a conventionally available cellulosic resin in a solvent such as α-terpineol.

The conductive powder, the Mo compound, the glass frit, and the organic vehicle may be mixed at the desired mixing ratio described above, then kneaded, and dispersed with a three-roller to prepare a conductor composition.

The conductor composition is filled into the via holes. The green sheet 1, which has been subjected to screen printing, is placed in a laminator with the base film facing up. The position of the green sheet 1 is adjusted by using pins of the laminator and the pilot holes in the surface of the base film. After thermal pressing is performed on the green sheet 1, the base film is removed.

This operation is repeated until the desired number of green sheets is stacked, thereby producing a laminate. Further, another green sheet is prepared by using a material such as alumina, and this green sheet is not sintered at the firing temperature of each of the green sheets 1 constituting the laminate. The green sheet thus prepared is stacked on the upper and the lower surface of the laminate as constraint layers 5. The constraint layer 5 may be made of zirconia, magnesia, or the like. This laminate is pressed, e.g., at 40° C. and 49 MPa with a hot press. Consequently, a green sheet laminate 11 having the constraint layers 5 on both surfaces is produced, as shown in FIG. 1. The firing temperature of the constraint layer 5 is, e.g., in the range of 1000 to 1800° C. For example, the alumina constraint layer 5 has a firing temperature of 1600° C.

The green sheet laminate 11 is degreased, e.g., at 350° C. to 600° C. and then is fired at 850° C. to 950° C., thus producing a multilayer ceramic substrate having a three-dimensional printed circuit that is formed inside and on the surface. At this time, the constraint layers 5 are not fired and can be removed easily with polishing, ultrasonic cleaning, blasting, or the like.

Figure 2:
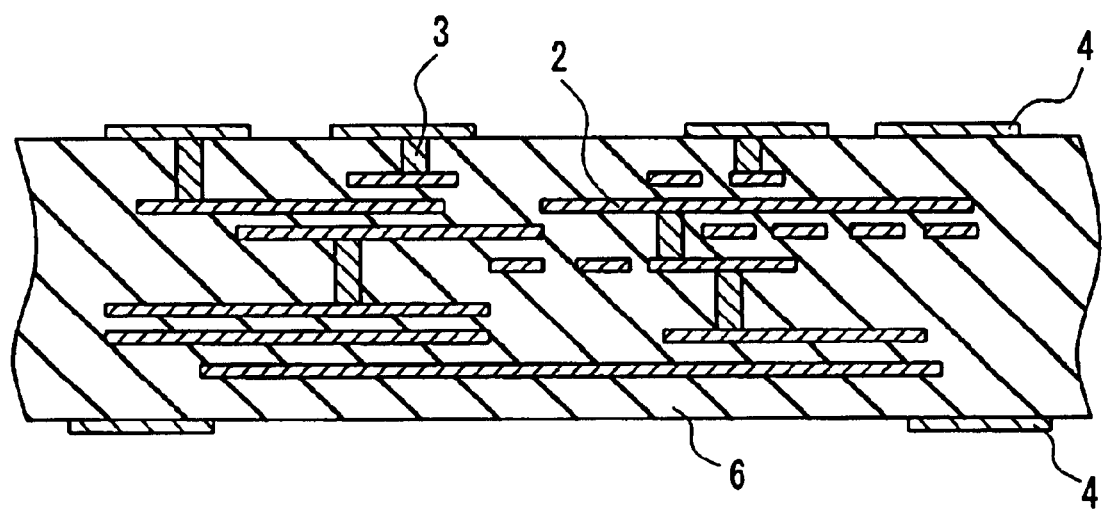
FIG. 2 is a cross-sectional view showing the configuration of a multilayer ceramic substrate according to an embodiment of the present invention.

FIG. 2 is a cross-sectional view showing a complete multilayer ceramic substrate. An internal electrode 2 is formed in a ceramic body 6 made of glass ceramics, and a surface electrode 4 is formed on the surface of the ceramic body 6. A connection between the internal electrodes 2 or between the surface electrode 4 and the internal electrode 2 is made by a via electrode 3.

Figure 3:
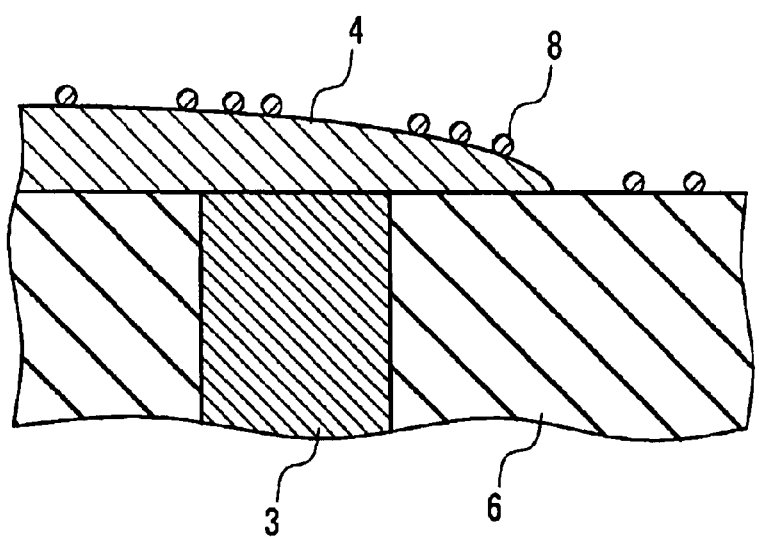
FIG. 3 is an enlarged cross-sectional view showing the surface of a multilayer ceramic substrate according to an embodiment of the present invention.

FIG. 3 is an enlarged view showing the surface of the multilayer ceramic substrate in FIG. 2. Oxide particles 8 are arranged on the surfaces of the surface electrode 4 and the ceramic body 6. This is because the constraint layer 5 is removed so that part of the constraint layer 5 is left as particles. The oxide particles 8 are a residue of the constraint layer 5 and may include at least one selected from alumina, zirconia, and magnesia as a main component. The surface electrode 4 with the oxide particles 8 on its surface can exhibit good resistance to heat in soldering, and thus defects caused by solder leaching can be reduced.

The solder leaching is a phenomenon that when chips are mounted, the surface electrode 4 diffuses into the molten solder. The arrangement of the oxide particles 8 on the surface electrode 4 can prevent the solder leaching.

Moreover, defects caused by solder flow can be reduced by making the surface of the multilayer ceramic substrate uneven when the constraint layer 5 is removed.

The solder flow is a phenomenon that the solder flows and spreads in the region other than the surface electrode 4, which causes a short circuit in the electrode. An increase in roughness of the surface of the ceramic body 6 on which the surface electrode 4 is not formed can prevent the solder flow.

If necessary, e.g., IC, a SAW filter, and chip components are mounted on the multilayer ceramic substrate thus produced. Then, the multilayer ceramic substrate is cut into a predetermined size by dicing or the like, resulting in a desired multilayer ceramic electronic component.

In this embodiment, the surface electrode 4 of the multilayer ceramic substrate is fired together with the ceramic body 6. However, the surface electrode 4 may be fired after firing the multilayer ceramic substrate.

As described above, a multilayer ceramic substrate of this embodiment can achieve high dimensional accuracy, flatness, no defect occurring in the vicinity of electrodes, and low conductor resistance of the electrodes.

EXAMPLE

Example 1

A multilayer ceramic substrate of the above embodiment was produced and evaluated with actual measurement. In this example, the multilayer ceramic substrates were produced by using conductor compositions that differ in conductive powder or Mo compound, and then the electrode and the ceramic body of each of the multilayer ceramic substrates were evaluated. Table 1 shows the results. The conductor compositions in Example 1 did not include a glass frit.

TABLE 1

| No. | Conductive powder | Average particle diameter (μm) | Amount of glass frit (wt part) | Amount of Mo compound in terms of Mo metal (wt part) | State in the vicinity of electrode | Conductor resistance (× $10^{-6}$ Ωcm) |
|---|---|---|---|---|---|---|
| Comparative example | Ag | 3 | 0 | 0 | defective | 1.8 |
| 1 | Ag | 3 | 0 | $MoO_3$ 0.075 (Mo: 0.05) | good | 1.8 |
| 2 | Ag | 3 | 0 | $MoO_3$ 1.5 (Mo: 1) | good | 2.0 |

TABLE 1-continued

| No. | Conductive powder | Average particle diameter ($\mu$m) | Amount of glass frit (wt part) | Amount of Mo compound in terms of Mo metal (wt part) | State in the vicinity of electrode | Conductor resistance ($\times 10^{-6}$ $\Omega$cm) |
|---|---|---|---|---|---|---|
| 3 | Ag | 3 | 0 | MoO$_3$ 3 (Mo: 2) | good | 2.2 |
| 4 | Ag | 3 | 0 | MoO$_3$ 3.75 (Mo: 2.5) | good | 2.5 |
| 5 | Ag | 3 | 0 | MoO$_3$ 4.5 (Mo: 3) | good | 4.0 |
| 6 | Ag | 3 | 0 | MoO$_3$ 7.5 (Mo: 5) | good | 4.9 |
| 7 | Ag | 3 | 0 | MoO$_3$ 15 (Mo: 10) | good | 6.1 |
| 8 | Ag | 3 | 0 | MoO$_3$ 22.5 (Mo: 15) | good | 8.3 |
| 9 | Ag | 0.5 | 0 | MoO$_3$ 3.75 (Mo: 2.5) | good | 2.3 |
| 10 | Ag | 5 | 0 | MoO$_3$ 3.75 (Mo: 2.5) | good | 2.5 |
| 11 | Ag | 10 | 0 | MoO$_3$ 3.75 (Mo: 2.5) | good | 3.5 |
| 12 | Ag 95 Pd 5 | 3 | 0 | MoO$_3$ 3.75 (Mo: 2.5) | good | 3.8 |
| 13 | Ag 99 Pt 1 | 3 | 0 | MoO$_3$ 3.75 (Mo: 2.5) | good | 2.5 |
| 14 | Ag | 3 | 0 | Mo 2.0 | good | 2.1 |
| 15 | Ag | 3 | 0 | MoSi$_2$ 3.2 (Mo: 2.0) | good | 2.3 |
| 16 | Ag | 3 | 0 | Mo octanoate 11.1 (Mo: 2.0) | good | 1.9 |

The multilayer ceramic substrates were evaluated based on the conductor resistance of an electrode and defects or cracks caused at the interface between a via electrode and a ceramic body or in the vicinity thereof. For defects caused in the vicinity of the via electrode, the cross section of the fired substrate was polished and observed with a microscope.

Figure 4:
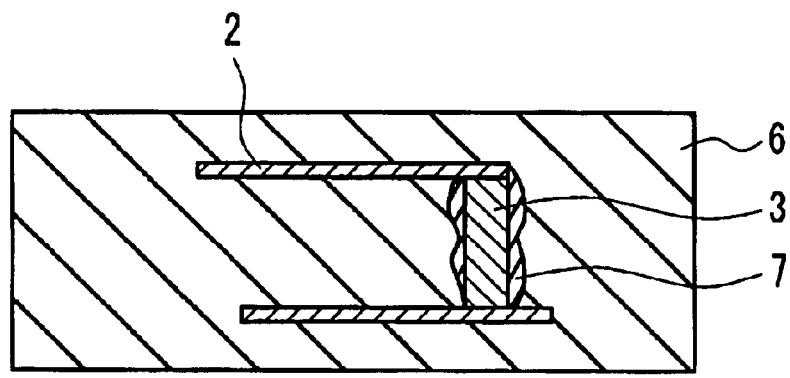
FIG. 4 is a cross-sectional view showing an example of defects in the vicinity of electrodes of a multilayer ceramic substrate in a comparative example.

Table 1 shows as a comparative example the measurement of a multilayer ceramic substrate that was produced by using a conductor composition made of Ag powder alone. In this case, a defect was detected in the vicinity of the via electrode. FIG. 4 is a cross-sectional view showing an example of the defect in the comparative example. As shown in FIG. 4, there is a defect 7 at the interface between the via electrode 3 and the ceramic body 6.

The conductor compositions of No. 1 to No. 7 in Table 1 included 0.05 to 10 parts by weight of MoO$_3$ (Mo compound) in terms of Mo metal with respect to 100 parts by weight of Ag powder. The multilayer ceramic substrates using these conductor compositions were free from defects in the vicinity of the via electrode 3.

No defect was caused in the multilayer ceramic substrate of No. 8, which was produced by using the conductor composition including 15 parts by weight of MoO$_3$ in terms of Mo metal. However, a reaction layer was generated at the interface between the via electrode 3 and the ceramic body 6, and the conductor resistance was too high. Therefore, this multilayer ceramic substrate was less desirable. Since a lower conductor resistance is desirable, the multilayer ceramic substrates of No. 1 to No. 4 are particularly preferable, in which the amount of MoO$_3$ is not less than 0.05 part by weight and less than 3 parts by weight in terms of Mo metal.

When the particle diameter of the conductive particles was too small, the electrode shrank faster than the green sheet did. Therefore, the electrode exerted stress on the unsintered green sheet, causing cracks in the ceramic body. When the particle diameter was too large, the sintering timing of the electrode was much later than that of the green sheet. Thus, defects were likely to occur particularly in the vicinity of the via electrode or the like. Moreover, the electrode was very difficult to be sintered, and the conductor resistance became higher. Thus, it is preferable to use Ag powder having an average particle diameter of 0.5 to 10 $\mu$m, such as the multilayer ceramic substrates of No. 9 to No. 11. When the particle diameter of the Ag powder was smaller than 0.5 $\mu$m or larger than 10 $\mu$m, structural defects were caused.

In addition to the Ag powder, the conductive powder can be mixed powder or alloy powder. Like No. 12 and No. 13, even if the multilayer ceramic substrate was produced by using the conductor composition including mixed powder of Ag and Pd or Pt, no defect was caused. Like No. 14 to No. 16, favorable results also were obtained by including Mo metal, a silicide, or an organic compound as the Mo compound, instead of an oxide Example 2

Multilayer ceramic substrates were produced by using conductor compositions that differ in the softening point and the amount of a glass frit, and then the electrode and the ceramic body of each of the multilayer ceramic substrates were evaluated in the same manner as Example 1. Table 2 shows the results.

TABLE 2

| No. | Conductive powder | Average particle diameter ($\mu$m) | Softening point and amount of glass frit (wt part) | Amount of Mo compound in terms of Mo metal (wt part) | State in the vicinity of electrode | Conductor resistance ($\times 10^{-6}$ $\Omega$cm) |
|---|---|---|---|---|---|---|
| 17 | Ag | 3 | 450° C. 3.0 | MoO$_3$ 3.75 (Mo: 2.5) | defective | 2.6 |
| 18 | Ag | 3 | 580° C. 3.0 | MoO$_3$ 3.75 (Mo:2.5) | defective | 2.7 |
| 19 | Ag | 3 | 670° C. 3.0 | MoO$_3$ 3.75 (Mo: 2.5) | good | 2.5 |
| 20 | Ag | 3 | 780° C. 3.0 | MoO$_3$ 3.75 (Mo: 2.5) | good | 2.6 |
| 21 | Ag | 3 | 850° C. 3.0 | MoO$_3$ 3.75 (Mo:2.5) | good | 2.5 |
| 22 | Ag | 3 | 780° C. 5.0 | MoO$_3$ 3.75 (Mo: 2.5) | good | 4.2 |
| 23 | Ag | 3 | 780° C. 10.0 | MoO$_3$ 3.75 (Mo:2.5) | good | 5.1 |
| 24 | Ag | 3 | 780° C. 15.0 | MoO$_3$ 3.75 (Mo: 2.5) | good | 8.9 |

The conductor compositions of No. 17 and No. 18 included a glass frit with a softening point of less than 650° C. The multilayer ceramic substrates using these conductor compositions had defects in the vicinity of the via electrode. The reason for this is considered to be as follows: the glass frit has a low softening point, and thus sintering of the conductive powder proceeds in the early stage, which leads to a difference in sintering timing between the conductive powder and the green sheet.

The conductor compositions of No. 19 to No. 21 included a glass frit with a softening point of not less than 650° C. Therefore, no defect was caused in the vicinity of the via electrode.

Even if the amount of glass frit was increased, like the conductor compositions of No. 22 to No. 24, no defect was caused in the vicinity of the via electrode of the multilayer ceramic substrate produced. However, the conductor resistance rose with an increase in the amount of glass frit. Therefore, the multilayer ceramic substrate of No. 24, which included more than 10 parts by weight of the glass frit with respect to 100 parts by weight of the conductive powder, was less desirable because the conductor resistance was too high.

The same tendency can be observed when a mixture of glass and ceramics that are used in the glass ceramic green sheet is used instead of the glass frit, though this is not described in the examples.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A multilayer ceramic substrate comprising:
   a glass ceramic body;
   a conductive pattern formed in the glass ceramic body and on at least one principal surface of the glass ceramic body; and
   a via conductor for making a connection between two or more of the conductive patterns,
   wherein the via conductor comprises a conductive material and a Mo compound or a Mo metal,
   the conductive material includes at least one selected from the group consisting of Ag, Au, Pt and Pd as a main component, and
   an amount of Mo compound or Mo metal is in an range of 0.05 to 10 parts by weight in terms of Mo metal with respect to 100 parts by weight of the conductive material.

2. The multilayer ceramic substrate according to claim 1, wherein oxide particles that include at least one selected from the group consisting of alumina, zirconia and magnesia as a main component are arranged on the at least one principal surface of the glass ceramic body.

3. The multilayer ceramic substrate according claim 2, wherein the oxide particles are arranged on the at least one principal surface of the glass ceramic body and the conductive pattern formed on the at least one principal surface.

4. The multilayer ceramic substrate according to claim 1, wherein the via conductor further includes a glass frit in an amount of not more than 10 parts by weight.

5. The multilayer ceramic substrate according to claim 1, wherein the via conductor further includes a frit of an inorganic composition used in the glass ceramic body in an amount of not more than 10 parts by weight.

6. The multilayer ceramic substrate according to claim 1, wherein the amount of Mo compound or Mo metal included in the via conductor is not less than 0.05 parts by weight and less than 3 parts by weight in terms of Mo metal.

7. A multilayer ceramic substrate produced by:
   forming a laminate by stacking a plurality of green sheets so that at least one of the green sheets has via holes filled with a conductor composition;
   stacking a constraint green sheet on both surfaces of the laminate, the constraint green sheet being made of ceramics that is sinterable at a temperature higher than a firing temperature of the laminate; and
   firing the laminate with the constraint green sheets,
   wherein the green sheets are made of glass ceramics,
   the conductor composition comprises conductive powder and a Mo compound or a Mo metal,
   the conductive powder includes at least one selected from the group consisting of Ag, Au, Pt and Pd, and
   an amount of Mo compound or Mo metal is in a range of 0.05 to 10 parts by weight in terms of Mo metal with respect to 100 parts by weight of the conductive powder.

8. The multilayer ceramic substrate according to claim 7, wherein the conductor composition further includes a glass frit in an amount of not more than 10 parts by weight.

9. The multilayer ceramic substrate according to claim 8, wherein the glass frit has a softening point of not less than 650° C.

10. The multilayer ceramic substrate according to claim 7, wherein the conductor composition further includes a frit of an inorganic composition used in the glass ceramics in an amount of not more than 10 parts by weight.

11. The multilayer ceramic substrate according to claim 7, wherein the amount of Mo compound or Mo metal included in the conductor composition is not less than 0.05 parts by weight and less than 3 parts by weight in terms of Mo metal.

12. The multilayer ceramic substrate according to claim 7, wherein the constraint green sheet includes at least one selected from the group consisting of alumina, zirconia, and magnesia as a main component.

13. The multilayer ceramic substrate according to claim 7, wherein the constraint green sheet is not shrinkable in an in-plane direction at a firing temperature of the laminate.

* * * * *

UNITED STATES PATENT AND TRADEMARK OFFICE
CERTIFICATE OF CORRECTION

PATENT NO. : 6,762,369 B2
DATED : July 13, 2004
INVENTOR(S) : Saito et al.

It is certified that error appears in the above-identified patent and that said Letters Patent is hereby corrected as shown below:

Column 10,
Line 35, "according claim 2" should read -- according to claim 2 --.

Signed and Sealed this

Eleventh Day of October, 2005

JON W. DUDAS
*Director of the United States Patent and Trademark Office*